(12) United States Patent
Cubero Pitel et al.

(10) Patent No.: US 6,952,871 B1
(45) Date of Patent: Oct. 11, 2005

(54) METHOD FOR MANUFACTURING PRINTED CIRCUIT BOARDS

(75) Inventors: José Antonio Cubero Pitel, Valls (ES); Luis Ara Alonso, Valls (ES)

(73) Assignee: Lear Automotive (EEDS) Spain, S.L., Valls (Tarragona) (ES)

( * ) Notice: Subject to any disclaimer, the term of this patent is extended or adjusted under 35 U.S.C. 154(b) by 0 days.

(21) Appl. No.: 10/168,720

(22) PCT Filed: Dec. 31, 1999

(86) PCT No.: PCT/ES99/00413

§ 371 (c)(1),
(2), (4) Date: Mar. 1, 2004

(87) PCT Pub. No.: WO01/50824

PCT Pub. Date: Jul. 12, 2001

(51) Int. Cl.⁷ .............................................. H05K 3/02
(52) U.S. Cl. ......................... 29/846; 29/825; 29/830; 29/831; 29/847; 427/96.1; 427/97.1; 427/97.3
(58) Field of Search ..................... 29/840, 846, 848; 216/20; 174/259, 260; 427/96.1, 97.1, 97.3

(56) References Cited

U.S. PATENT DOCUMENTS

| | | | |
|---|---|---|---|
| 3,177,103 A | * | 4/1965 | Tally et al. .................... 216/20 |
| 4,087,300 A | | 5/1978 | Adler |
| 5,233,753 A | * | 8/1993 | Wolf et al. .................... 29/831 |
| 5,525,433 A | * | 6/1996 | Poutasse et al. ............. 428/674 |
| 5,861,076 A | | 1/1999 | Adlam et al. |
| 6,182,359 B1 | * | 2/2001 | Nieto ........................... 29/848 |
| 6,516,665 B1 | * | 2/2003 | Varadan et al. ........... 73/504.01 |
| 6,668,450 B1 | * | 12/2003 | Haller et al. ................... 29/846 |

FOREIGN PATENT DOCUMENTS

| | | |
|---|---|---|
| EP | 0 923 278 | 6/1999 |
| EP | 0 929 208 | 7/1999 |
| ES | 2 125 821 | 3/1999 |

* cited by examiner

Primary Examiner—Carl J. Arbes
(74) Attorney, Agent, or Firm—Sughrue Mion, PLLC

(57) ABSTRACT

It consists of making a first engraving over a first face of a panel of electro-conducting material to form some reliefs and depressions corresponding to future tracks and intermediate tracks; subjecting said first face to a black oxide treatment (40); applying a layer of an adhesive material over said first face previously engraved and treated with black oxide; applying by injection moulding a dielectric material (20) over said previously engraved first face, treated and with the adhesive applied, covering said reliefs and filling said depressions; and carrying out a second selective engraving over a second face, opposite to the first one, of the mentioned panel to eliminate the material thereof corresponding to said future intermediate tracks, so that some finished tracks (16) remain insulated from each other, partially embedded on a face of said dielectric material (20) and separated by intermediate tracks (18).

30 Claims, 2 Drawing Sheets

METHOD FOR MANUFACTURING PRINTED CIRCUIT BOARDS

This application is a 371 of PCT/ES99/00413, filed Dec. 31, 1999. The disclosure of which is incorporated herein by reference.

FIELD OF THE INVENTION

The present invention concerns a manufacturing process for printed circuit boards of the type comprising to carry out a first selective engraving by machining or chemical attack over one face of a panel made of electro-conducting material to form reliefs corresponding to future tracks and some depressions corresponding to future intermediate tracks; applying by injection moulding or another coating method, a dielectric material over said face of the electro-conducting material board, covering said reliefs and filling said depressions and making a second selective engraving by machining or chemical attack over a second face, opposite to the first one, of said electro-conducting material to eliminate the material thereof, corresponding to said intermediate tracks, so that they are insulated from each other over said dielectric material.

The printed circuit boards consist of a one or more electro-conducting material panels, such as copper, laminated together with one or more laminates of dielectric material, such as a polymeric material. By treating a copper plate, typically applying, by a photographic method, a reserve mask and further chemical attack, obtaining the conducting tracks of the circuit. A problem presented by such printed circuit boards is that the copper plates tend to separate from the dielectric substrates, especially near areas where cuts, holes, etc, have been made or where later chemical or heat treatment has been applied.

TECHNICAL BACKGROUND

Patent DE-A-1,521,770 describes a process of the type indicated and comprising the injection of a polymeric material, according to the dielectric substrate, over one face of a conducting material panel, typically copper, on which some reliefs and their corresponding grooves have been made corresponding to future tracks and intermediate tracks, respectively. When the substrate has polymerised, a second face of the copper plate, opposite to the first one, is engraved with some grooves, corresponding to the grooves pre-existing on the first face, until eliminating all the copper material corresponding to said intermediate tracks. In this way, the tracks remain insulated from each other and partially embedded in the dielectric material of the substrate. However, in this process, the adhesion of the copper material with respect to the substrate is poor, so that said tracks tend to be detached. Said patent DE-A-1,521,770 is the background nearest to the state-of-the-art.

On the other hand, processes to improve the joint between an electro-conducting metallic plate, typically of copper, and a dielectric polymeric substrate or embedded in a polymer are well known in the state-of-the-art.

U.S. Pat. No. 5,861,076 describes a method to prepare multi-layer printed circuit boards involving the treatment of copper plate surfaces with black oxide, followed by an aqueous reducing solution containing sodium metabisulphite and sodium sulphite, providing greater roughness to the black oxide surface, then subjecting it to passivation. One or more plates treated in this way are then laminated with one or more polymeric substrate laminates or with polymeric contents by means of a process involving pressure and heat during a relatively long time interval. According to said increased roughness, the joining capacity between the copper plates and the substrate laminates is improved.

Nevertheless, this method involves subjecting the copper plates to a plurality of chemical processes whose purpose is to increase surface roughness thereof in order to improve adhesion. Said processes require careful control of each phase and make the product more expensive without providing an overall effective solution to the problem of weakness of the joint between the copper tracks and the substrate.

BRIEF DESCRIPTION OF THE INVENTION

Therefore, the object of the present invention is to provide a manufacturing process for printed circuit boards by means of over moulding the substrate assuring a strong joint between the conducting tracks and the dielectric substrate, said process being easy and economical.

According to this invention, the object is obtained by means of a manufacturing process for printed circuit boards of the type comprising the steps of carrying out a first selective engraving by machining or chemical attack over the first face of an electro-conducting material panel to form some reliefs corresponding to future tracks and some depressions, corresponding to future intermediate tracks; applying by injection moulding, a dielectric material over said first face of the electro-conducting material board, covering said reliefs and filling said depressions and carrying out a second selective engraving by means of machining or by chemical attack over the second face opposite to the first one of said board of electro-conducting material to eliminate the material thereof, corresponding to said future intermediate tracks, so that said tracks remain insulated from each other, partially embedded on a face of said dielectric material.

With the purpose of providing a greater resistance in the joints between materials, after the first engraving stage and before said moulding by injection stage, the process of the present invention also comprises the stages to subject said first engraved face of the panel of electro-conducting material to a surface treatment improving the joint capacity and applying a layer of adhesive material over said first engraved and superficially treated face of the panel of the electro-conducting material.

With this process, a dielectric substrate is obtained with a plurality of conducting material tracks, partially embedded and strongly adhered on one of its faces. However, the process of the present invention is also suitable to produce double face printed circuits. For this reason, the moulding by injection stage is carried out between two of said panels of conducting material, kept separated by a predetermined distance, with their respective first faces previously engraved, treated and with their respective layers of adhesive material applied, one in front of the other, performing said second selective engraving by machining or by chemical attack, over the respective second faces, opposite to the first ones, of the two mentioned panels of electro-conducting material to eliminate the material thereof corresponding to said future intermediate tracks, so that said tracks are insulated from each other, partially embedded and strongly adhered over two opposite faces of said dielectric material.

Said surface treatment improving the joining capacity comprises an operation of black oxide, currently known, consisting of placing said first face of the panel of electro-conducting material in contact with an aqueous solution of sodium hydroxide and sodium hypochlorite, producing a chemical micro-attack to provide a determined surface roughness.

The process of the present invention foresees to carry out said black oxide operation according to two alternative methods. One of them, consists of applying a protecting mask to said complete second face and/or over said parts of the panel of electro-conducting material with no need to be treated; subjecting the panel of electro-conducting material to an immersion or spraying treatment and then removing said protecting mask to leave a layer of black oxide only in those areas destined to receive dielectric material. The other alternative method consists of subjecting the panel of electro-conducting material to treatment by total immersion or spraying and then to eliminate the black oxidation of said second face and/or parts not requiring said treatment to leave a layer of black oxide only in those areas destined to receive the dielectric material.

Over the surface treated with black oxide, the mentioned application of said layer with an adhesive material, typically by spraying, is carried out. The adhesive material, preferably comprising a base of organic solvents and a solid content consisting of synthetic elastomers, is subjected to pre-drying after application, without performing curing, which may be in the air at room temperature or in an oven at a temperature of 25–100° C., to provoke the evaporation of said solvents before the injection moulding stage, involving the entry, under pressure, of dielectric material, melted in a mould, in which the previously prepared panel is located with its first face arranged to receive the dielectric material. Therefore, the adhesive material is activated on coming into contact with said dielectric material at elevated pressure and temperature, providing strong adherence between said dielectric material and the panel of electro-conducting material.

The first engraving stage to create the initial reliefs and depressions may be carried out by using conventional methods, like that involving the exposure of said panel of electro-conducting material to chemical polishing, depositing a layer of photosensitive material over both the first and second faces of the panel of electro-conducting material; insulating said layer of photosensitive material from the first face by means of a photolyte with an image pattern corresponding to said future tracks; insulating said layer of photosensitive material from the second face completely; eliminating those parts of the layers of photosensitive layers not insulated; subjecting the panel of electro-conducting material with the parts of the layers of the remaining photosensitive material to engraving by chemical attack and eliminating the parts of the layers of photosensitive material remaining on both faces.

The second engraving stage to separate and insulate the finished tracks may also be carried out by conventional methods. A suitable method comprises depositing a layer of photosensitive material over said second face of the panel of electro-conducting material, insulating the latter form the second face by means of a photolyte, corresponding to said future tracks, matching said reliefs of the first face; eliminating those parts of the layer of photosensitive material not insulated; subjecting the panel of electro-conducting material, which is adhered by the first face to the dielectric material, having the parts of the layers of remaining photosensitive material on the second face, exposed to chemical attack engraving and eliminating the parts of the layers of the photosensitive material remaining on the second face.

It is normal to solder the different electronic components to complete the printed circuit boards by means of wave soldering or reflow soldering techniques or surface assembly. For the latter, the process of the present invention, after the second engraving stage, also comprises an application stage of an anti-soldering mask, including the application of a layer of photosensitive material over said second face of the layer of electro-conducting material forming said tracks and over the exposed areas of the dielectric material in said intermediate tracks; insulating said layer of photosensitive material from the second face by means of a photolyte with a pattern corresponding to some soldering crowns; eliminating those parts of the layer of non-insulated photosensitive material. This operation leaves exposed only the mentioned soldering crowns, while the rest of the circuit is protected by the anti-soldering mask. Later on, said soldering crowns receive a passivation treatment and finally a stamping stage is performed to open some holes in the soldering crowns to insert electronic components.

The first engraving to make said depressions corresponding to future intermediate tracks reaches a depth from 85 to 95% of the thickness of the panel of electro-conducting material, so that said finished tracks, partially embedded in the dielectric material, have a protruding part from 5 to 15% of its thickness. This represents a great contact surface between the dielectric material and the electro-conducting material, normally copper, of the tracks with the black oxide and the adhesive between both of them, providing great resistance to the joint between the tracks and the substrate.

For power applications, said copper panel has an approximate thickness of 400 $\mu$m.

EXPLANATION OF THE DRAWINGS

The invention will be better understood by the following description referring to the attached drawings in which.

DETAILED DESCRIPTION OF AN EMBODIMENT EXAMPLE

Figure 1:
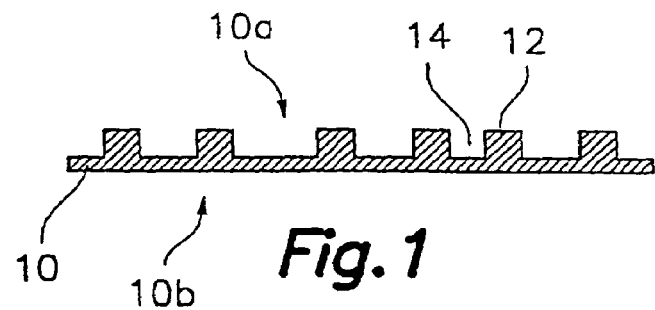
FIGS. 1 to 6 are cross-sectional views showing different stages in the manufacturing process of single face printed circuit boards, according to the present invention.

Firstly referring to FIG. 1, the first step of the process consists of making a first selective engraving over the first face 10a of a panel 10 of electro-conducting material to form some reliefs 12 corresponding to future tracks and some depressions 14 corresponding to future intermediate tracks. Said first engraving typically comprises subjecting said panel 10 of electro-conducting material to chemical polishing; depositing a layer of photosensitive material over both the first and second faces 10a and 10b of the panel 10 of electro-conducting material; insulating said layer of photosensitive material from the first face 10a, by means of a photolyte corresponding to said future tracks; insulating said layer of photosensitive material from the second face 10b completely; eliminating those parts of the layers of photosensitive material not insulated; subjecting the panel 10 of electro-conducting material with the parts of the layers of remaining photosensitive material, to engraving by chemical attack; and eliminating the parts of the photosensitive layers remaining on both faces.

Figure 2:
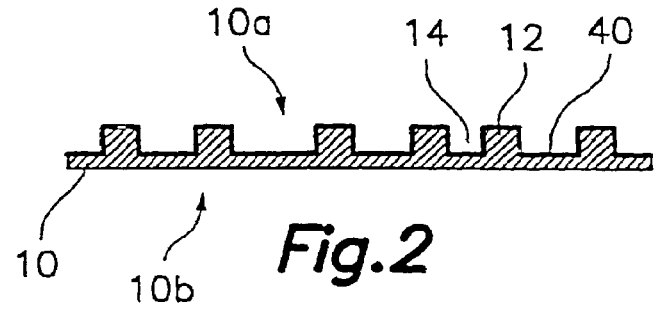

Then (see FIG. 2), said first engraved face 10a of the panel 10 of electro-conducting material is subjected to a surface treatment, improving the joining capacity, comprising a black oxide operation consisting of placing in contact said first face 10a of the panel 10 of electro-conducting material with an aqueous solution of sodium hydroxide and sodium hypochlorite producing a chemical micro-attack to provide a determined surface roughness. Said black oxide operation may be carried out either by applying a protection mask to said second phase 10b and/or parts not needing to be treated of the panel 10 of electro-conducting material; then, subjecting the panel 10 of electro-conducting material to immersion or spraying treatment; and finally removing said protection mask to leave a layer of black oxide 40 only in those areas destined to receive the dielectric material 20 or totally subjecting the panel 10 of electro-conducting material to the immersion or spraying treatment; and then eliminating the black oxidation of said second phase 10b and/or parts not requiring said treatment to leave a layer of black oxide 40 only in those areas destined to receive the dielectric material 20.

Figure 3:
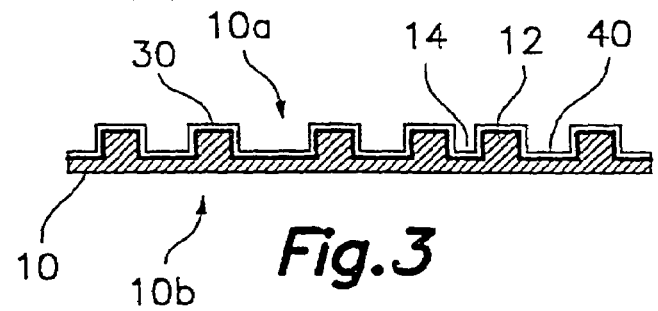

Then (see FIG. 3), proceed to apply, for example, by spraying, a layer of adhesive material 30 over said first phase 10a, previously engraved and superficially treated, of the panel 10 of electro-conducting material. Said adhesive material 30 comprising a base of organic solvents and a solid content of synthetic elastomers.

Then, the mentioned layer of adhesive material 30 is subjected to pre-drying, without reaching curing, to provoke the evaporation of said solvents before the moulding by injection stage. Said pre-drying may be carried out in the air at room temperature or in an oven at a temperature from 25 to 100° C.

Figure 4:
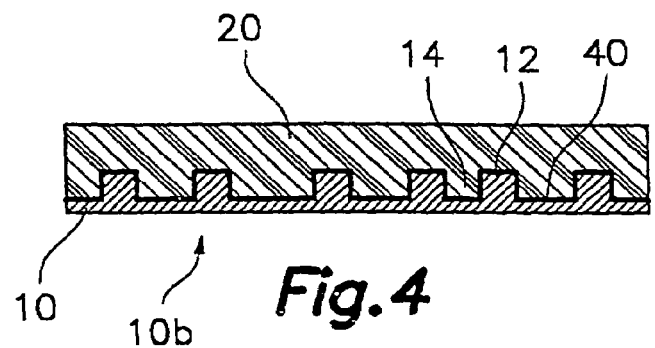

The following stage (see FIG. 4) consists of applying by injection moulding a dielectric material 20 over said previously treated first face 10a of the panel 10 of electro-conducting material, and with the layer of adhesive 30 applied, covering said reliefs 12 and filling said depressions 14. This overmoulding involves the use of a mould in which the panel 10 of electro-conducting material is placed with its first face 10a located such that it may receive the melted dielectric material 20 injected at a relatively high pressure and temperature. In this way, the adhesive material 30 applied over the first face 10a of the panel 10 of electro-conducting material is activated on entering in contact with said dielectric material 20 at high temperature and pressure, forming strong adhesion between said dielectric material 20 and the panel 10 of electro-conducting material.

Figure 5:
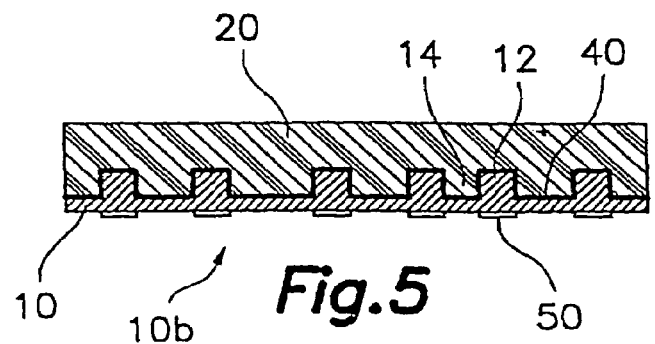

Then (see FIG. 5), a layer of photosensitive material is deposited over said second phase 10b of the panel 10 of electro-conducting material; insulating said layer of photosensitive material from the second face 10b by means of a photolyte corresponding to said future tracks, coinciding with said reliefs 12 of the first face 10a and eliminating those parts of the layer of photosensitive material not insulated, leaving only some parts of the layers of remaining photosensitive material 50 as reserve masks.

Figure 6:
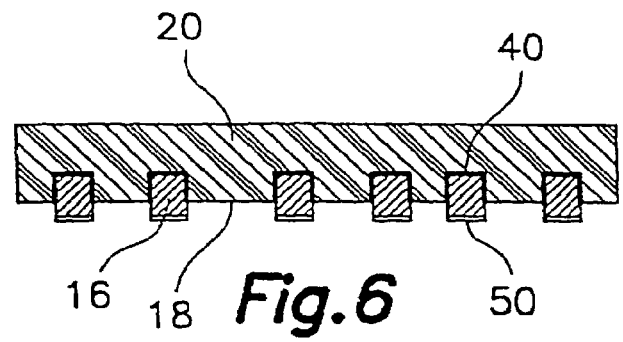

Then (see FIG. 6) the panel 10 of electro-conducting material, which is adhered by the first face 10a to the dielectric material 20 and having parts of the layers of remaining photosensitive material 50 over the second face 10b, it is subjected to engraving by chemical attack. This second selective engraving by chemical attack, over the second face 10b, opposite to the first face 10a of the mentioned panel 10 of electro-conducting material, eliminates the material thereof corresponding to said future intermediate tracks, so that some definite tracks 16 are isolated from each other, separated by intermediate tracks 18 and partially embedded over a face of said dielectric material 20.

Figure 7:
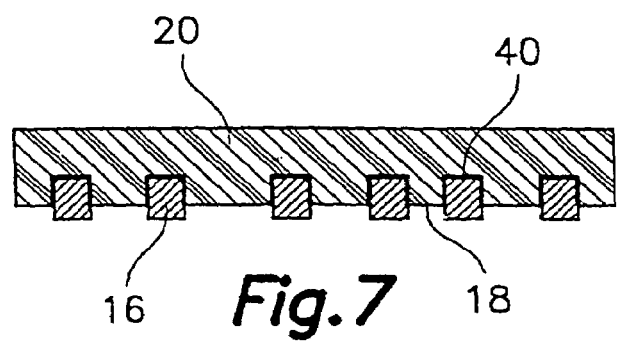
FIG. 7 is a cross-sectional view of a single face printed circuit board obtained by means of the process comprising the stages of FIGS. 1 to 6.

Finally (see FIG. 7), the parts of the remaining layer of photosensitive material 50 in the tracks 16 are eliminated, hence obtaining a printed circuit board consisting of a dielectric material substrate 20 to which a plurality of tracks 16 are strongly joined separated by some corresponding intermediate tracks 18. The fact that the tracks 16 are partially embedded in the substrate of dielectric material 20 should be mentioned and also that they are adhered to the latter according to the aforementioned special formation process. In a useful embodiment example, for power printed circuit boards, the panel 10 of electro-conducting material is a copper panel with a thickness of approximately 0.400 $\mu$m suitable to resist the temperatures reached in power applications, and the first engraving to carry out said depressions 14 corresponding to future intermediate tracks (see FIG. 1 again) reaches a depth from 85 to 95% thickness of the panel 10 of electro-conducting material, so that said finished tracks 16, partially embedded in the dielectric material 20, have a protruding part which has a thickness from 5 to 15%.

Generally, the printed circuit board receives, according to its final use, some later finishing treatments. For example, after the last step of the second engraving a conventional stage is carried out (not shown) of application of anti-soldering mask which involves the application of a layer of photosensitive material over said second face 10b of the layer of electro-conducting material forming said tracks and over the exposed areas of the dielectric material 20 in said intermediate tracks; insulating said layer of photosensitive material from the second face 10b by means of a photolyte with a pattern corresponding to some soldering crowns; and to eliminate those parts of the layer of photosensitive material not insulated. Usually, a passivation treatment of said soldering crowns is carried out followed by stamping to open some holes in the soldering crowns to insert electronic components.

Figure 8:
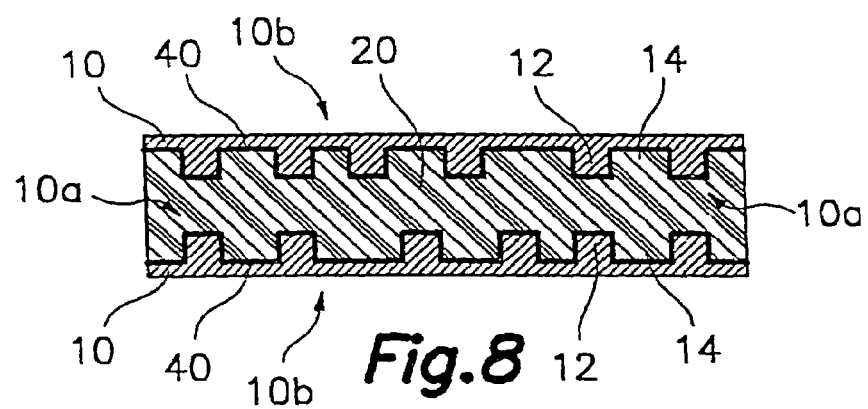
FIG. 8 is a cross-sectional view showing an intermediate stage in the manufacturing process of double face printed circuit boards, according to the present invention and, FIG. 9 is a cross-sectional view of double face printed circuit board obtained by means of the process comprising the stages of FIG. 8.
Figure 9:
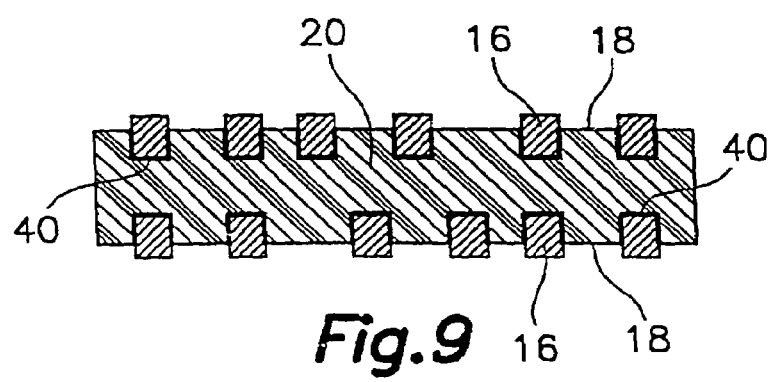

The process of this invention is also applicable to the manufacture of double face printed circuits. For the latter, the moulding by injection stage (see FIG. 8), is carried out between two of said panels 10 of conducting material kept separated by a predetermined distance, with their respective first faces 10a previously engraved, treated and with their respective layers of adhesive material 30 applied, one in front of the other, said second selective engraving being carried out (see FIG. 9) over the respective second faces 10b, opposite to the first, of the mentioned two panels 10 of electro-conducting material to eliminate the material thereof corresponding to said future intermediate tracks, so that said tracks 16 are isolated from each other, separated by intermediate tracks 18 and partially embedded over two opposite faces of said dielectric material 20.

It should be mentioned that an expert in the art would be capable of introducing numerous changes or variations without varying the scope of the invention, defined by the following claims. For example, one or more of the engraving stages may be alternatively carried out by mechanical methods or by laser radiation and also other stages may be carried out by any of the suitable known conventional methods.

What is claimed is:

1. A manufacturing process for printed circuit boards of the type comprising the following steps:
    making a first selective engraving over a first face (10a) of a panel (10) of electro-conducting material to form reliefs (12) corresponding to future tracks and depressions (14) corresponding to future intermediate tracks;

applying by injection moulding a dielectric material 20 over said first face (10*a*) of the panel (10) of electro-conducting material, covering said reliefs (12) and filling said depressions (14); and, making a second selective engraving over a second phase (10*b*) opposite to the first one of the mentioned panel (10) of electro-conducting material to eliminate the material thereof, corresponding to said future intermediate tracks, so that some finished tracks (16) remain, isolated from each other, separated by intermediate tracks (18) and partially embedded over a face of said dielectric material (20), characterised in that, after the first engraving stage and before said injection moulding stage, it also comprises the following stages:

subjecting said previously engraved first face (10*a*) of the panel (10) of electro-conducting material to a surface treatment improving the joining capacity which comprises a black oxide operation consisting of placing said first face (10*a*) of the panel (10) of electro-conducting material in contact with an aqueous solution of sodium hydroxide and sodium hypochlorite producing a chemical micro-attack to provide a determined surface roughness; and applying a layer of adhesive material (30) over said engraved and superficially treated first face (10*a*) of the panel (10) of electro-conducting material.

2. A process according to claim 1, characterised in that the injection moulding stage is carried out between two of said panels (10) of conducting material kept separated by a predetermined distance, with their respective first faces (10*a*) previously engraved, treated superficially and with their respective layers of adhesive material (30) applied, one in front of the other, said selective second engraving being made over the respective second faces (10*b*) opposite to the first ones, of the mentioned two panels (10) of electro-conducting material to eliminate the material thereof, corresponding to said future intermediate tracks, so that some tracks (16) remain insulated from each other, separated by intermediate tracks (18) and partially embedded over two opposite faces of said dielectric material (20).

3. A process according to claim 1, characterised in that said black oxide operation comprises:

applying a protection mask to said second face (10*b*) and/or parts not requiring treatment of the panel (10) of electro-conducting material;

subjecting the panel (10) of electro-conducting material to immersion or spraying treatment; and then, removing said protection mask to leave a layer of black oxide (40) only in those areas destined to receive the dielectric material (20).

4. A process according to claim 1, characterised in that black oxide operation comprises:

completely subjecting the panel (10) of electro-conducting material to immersion or spraying treatment; and then, eliminating the black oxidation from said second phase (10*b*) and/or parts not requiring said treatment to leave a layer of black oxide (40) only in those areas destined to receive the dielectric material (20).

5. A process according to claim 1, characterised in that said application of a layer of an adhesive material (30) is carried out by spraying.

6. A process according to claim 1, characterised in that said adhesive material (30) comprises a base of organic solvents and a solid content formed by synthetic elastomers.

7. A process according to claim 6, characterised in that the mentioned layer of adhesive material (30) is subjected to pre-drying, without reaching curing, to provoke the evaporation of said solvents before the injection moulding stage.

8. A process according to claim 7, characterised in that said pre-drying is carried out in the air at room temperature.

9. A process according to claim 7, characterised in that said pre-drying is carried out in an oven from 25 to 100° C.

10. A process according to claim 1, characterised in that during said injection moulding stage, the adhesive material (30) is activated on coming into contact with said dielectric material (20) at high pressure and temperature, providing adhesion between said dielectric material (20) and the panel (10) of electro-conducting material.

11. A process according to claim 1, characterised in that the first engraving stage comprises:

submitting said panel (10) of electro-conducting material to chemical polishing; depositing a layer of photosensitive material over both the first and second faces (10*a*, 10*b*) of the panel (10) of electro-conducting material;

insulating said layer of photosensitive material of the first face (10*a*) by means of a photolyte corresponding to said future tracks;

insulating said layer of photosensitive material of the second face (10*b*) completely;

eliminating those parts of the not insulated layers of the photosensitive material;

subjecting the panel (10) of electro-conducting material, with the parts of the layers of remaining photosensitive material to engraving by chemical attack; and eliminating the parts of the layers of photosensitive material remaining on both faces.

12. A process according to claim 1, characterised in that the stage of the second engraving comprises:

depositing a layer of photosensitive material over said second face (10*b*) of the panel (10) of electro-conducting material;

insulating said layer of photosensitive material of the second face (10*b*) by means of a photolyte corresponding to said future tracks, in a position coinciding with said reliefs (12) of the first face (10*a*);

eliminating those parts of the layer of non-insulated photosensitive material;

subjecting the panel (10) of electro-conducting material, adhered by the first face (10*a*) to the dielectric material (20) and with the parts of the remaining layers of photosensitive material (50) of the second face (10*b*), to an engraving by chemical attack to insulate said tracks (16), and eliminating the parts of the remaining layers of photosensitive material (50) on the tracks (16).

13. A process according to claim 1, characterised in that both the first and second engraving stages are carried out mechanically.

14. A process according to claim 1, characterised in that both the first and second engraving stages are carried out by laser radiation.

15. A process according to claim 1, characterised in that after the second engraving stage, it also comprises an application stage of an anti-soldering mask including:

applying a layer of photosensitive material over the exposed areas of the electro-conducting material forming said tracks (16) and over the exposed areas of the dielectric material (20) in said intermediate tracks (18);

insulating said layer of photosensitive material from the second face (10*b*) by means of a photolyte with a pattern corresponding to some soldering crowns; and eliminating those parts of the layer of photosensitive material not insulated.

16. A process according to claim 15, characterised in that it also comprises an application stage of a passivation treatment of said soldering crowns.

17. A process according to claim 16, characterised in that it also comprises a stamping stage to open some holes in the soldering crowns to insert electronic components.

18. A process according to claim 1, characterised in that the engraving of the first engraving stage to make said depressions (14) corresponding to future intermediate tracks reaches a depth from 85% to 95% of the thickness of the panel (10) of electro-conducting material, so that said finished tracks (16), partially embedded in dielectric material (20), have a protruding part representing from 5 to 15% of its thickness.

19. A process according to claim 1, characterised in that said panel (10) of electro-conducting material is a copper panel.

20. A process according to claim 19, characterised in that said panel (10) of copper has an approximate thickness of 400 μm, suitable for power applications.

21. A process according to claim 2, characterised in that said application of a layer of an adhesive material (30) is carried out by spraying.

22. A process according to claim 2, characterised in that said adhesive material (30) comprises a base of organic solvents and a solid content formed by synthetic elastomers.

23. A process according to claim 2, characterised in that during said injection moulding stage, the adhesive material (30) is activated on coming into contact with said dielectric material (20) at high pressure and temperature, providing adhesion between said dielectric material (20) and the panel (10) of electro-conducting material.

24. A process according to claim 2, characterised in that the first engraving stage comprises:
submitting said panel (10) of electro-conducting material to chemical polishing; depositing a layer of photosensitive material over both the first and second faces (10a, 10b) of the panel (10) of electro-conducting material;
insulating said layer of photosensitive material of the first face (10a) by means of a photolyte corresponding to said future tracks;
insulating said layer of photosensitive material of the second face (10b) completely;
eliminating those parts of the not insulated layers of the photosensitive material;
subjecting the panel (10) of electro-conducting material, with the parts of the layers of remaining photosensitive material to engraving by chemical attack; and eliminating the parts of the layers of photosensitive material remaining on both faces.

25. A process according to claim 2, characterised in that the stage of the second engraving comprises:
depositing a layer of photosensitive material over said second face (10b) of the panel (10) of electro-conducting material;
insulating said layer of photosensitive material of the second face (10b) by means of a photolyte corresponding to said future tracks, in a position coinciding with said reliefs (12) of the first face (10a);
eliminating those parts of the layer of non-insulated photosensitive material;
subjecting the panel (10) of electro-conducting material, adhered by the first face (10a) to the dielectric material (20) and with the parts of the remaining layers of photosensitive material (50) of the second face (10b), to an engraving by chemical attack to insulate said tracks (16), and eliminating the parts of the remaining layers of photosensitive material (50) on the tracks (16).

26. A process according to claim 2, characterised in that both the first and second engraving stages are carried out mechanically.

27. A process according to claim 2, characterised in that both the first and second engraving stages are carried out by laser radiation.

28. A process according to claim 2, characterised in that after the second engraving stage, it also comprises an application stage of an anti-soldering mask including:
applying a layer of photosensitive material over the exposed areas of the electro-conducting material forming said tracks (16) and over the exposed areas of the dielectric material (20) in said intermediate tracks (18);
insulating said layer of photosensitive material from the second face (10b) by means of a photolyte with a pattern corresponding to some soldering crowns; and
eliminating those parts of the layer of photosensitive material not insulated.

29. A process according to claim 2, characterised in that the engraving of the first engraving stage to make said depressions (14) corresponding to future intermediate tracks reaches a depth from 85% to 95% of the thickness of the panel (10) of electro-conducting material, so that said finished tracks (16), partially embedded in dielectric material (20), have a protruding part representing from 5 to 15% of its thickness.

30. A process according to claim 2, characterized in that said panel (10) of electro-conducting material is a copper panel.

* * * * *